(12) United States Patent
Scheiper

(10) Patent No.: US 8,664,072 B2
(45) Date of Patent: Mar. 4, 2014

(54) SOURCE AND DRAIN ARCHITECTURE IN AN ACTIVE REGION OF A P-CHANNEL TRANSISTOR BY TILTED IMPLANTATION

(75) Inventor: Thilo Scheiper, Dortmund (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/483,759

(22) Filed: May 30, 2012

(65) Prior Publication Data

US 2013/0320409 A1   Dec. 5, 2013

(51) Int. Cl.
*H01L 21/336* (2006.01)

(52) U.S. Cl.
USPC .......................................... 438/302; 438/164

(58) Field of Classification Search
USPC .................................. 438/302, 164
See application file for complete search history.

(56) References Cited

U.S. PATENT DOCUMENTS

| | | | |
|---|---|---|---|
| 5,177,027 A | 1/1993 | Lowrey et al. | 438/270 |
| 6,580,137 B2 | 6/2003 | Parke | 257/401 |
| 6,881,635 B1 | 4/2005 | Chidambarrao et al. | 438/300 |
| 7,358,149 B2 | 4/2008 | Wang et al. | 438/433 |
| 7,482,615 B2 | 1/2009 | Zhu | 257/1 |
| 7,531,423 B2 | 5/2009 | Cheng et al. | 438/409 |
| 7,888,201 B2 | 2/2011 | Yeo et al. | 438/238 |
| 8,049,251 B2 | 11/2011 | Shima | 257/192 |
| 2005/0242340 A1 | 11/2005 | Chidambarrao et al. | 257/19 |
| 2005/0282342 A1 | 12/2005 | Adan | 438/294 |
| 2006/0286757 A1 | 12/2006 | Power et al. | 438/305 |
| 2007/0049022 A1 | 3/2007 | Chen et al. | 438/682 |
| 2008/0318385 A1 | 12/2008 | Kavalieros et al. | 438/285 |
| 2009/0170268 A1 | 7/2009 | Teo et al. | 438/285 |
| 2010/0289093 A1 | 11/2010 | Yang et al. | 257/408 |
| 2010/0327361 A1 | 12/2010 | Benaissa et al. | 257/368 |
| 2011/0006344 A1 | 1/2011 | Murthy et al. | 257/190 |
| 2011/0101418 A1 | 5/2011 | Murthy et al. | 257/190 |
| 2011/0147842 A1 | 6/2011 | Cappellani et al. | 257/365 |
| 2011/0163379 A1 | 7/2011 | Sleight et al. | 257/347 |
| 2012/0100674 A1 | 4/2012 | Anderson et al. | 438/157 |
| 2012/0161238 A1 | 6/2012 | Scheiper et al. | 257/368 |
| 2012/0241864 A1* | 9/2012 | Gerhardt et al. | 257/368 |

* cited by examiner

*Primary Examiner* — Thien F Tran
(74) *Attorney, Agent, or Firm* — Amerson Law Firm, PLLC

(57) ABSTRACT

In sophisticated P-channel transistors, which may frequently suffer from a pronounced surface topography of the active regions with respect to the surrounding isolation regions, superior performance may be achieved by using a tilted implantation upon forming the deep drain and source regions, preferably with the tilt angle of 20 degrees or less, thereby substantially avoiding undue lateral dopant penetration into sensitive channel areas.

19 Claims, 8 Drawing Sheets

SOURCE AND DRAIN ARCHITECTURE IN AN ACTIVE REGION OF A P-CHANNEL TRANSISTOR BY TILTED IMPLANTATION

BACKGROUND OF THE INVENTION

1. Field of the Invention

Generally, the present disclosure relates to the field of semiconductor manufacturing, and, more particularly, to contact areas of transistors having a shallow drain and source dopant profile.

2. Description of the Related Art

Semiconductor devices, such as advanced integrated circuits, typically contain a large number of circuit elements, such as transistors, capacitors and the like, which are formed on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

To establish the connection of the circuit elements to the first metallization layer, an appropriate contact structure is provided that connects to a respective contact region of a circuit element, such as a gate electrode and the drain/source regions of field effect transistors, and to a respective metal line in the first metallization layer. The vertical contact structure, including a plurality of contacts or contact plugs, is formed in an inter-layer dielectric material that encloses and passivates the circuit elements.

The continuing shrinkage of dimensions of circuit elements, such as transistors, has been, and will remain, a major goal of semiconductor manufacturers, since significant gain in performance of semiconductor devices may be accomplished in terms of operating speed, production costs and the like. For example, the gate length of field effect transistors has now reached 0.05 µm and less and, hence, fast and powerful logic circuitry, such as microprocessors, storage devices and the like, may be formed on the basis of these transistors, due to increased packing density, thereby also providing the possibility of incorporating more and more functions into a single die region. For instance, the amount of storage incorporated into modern CPUs has steadily increased, thereby enhancing overall performance of microprocessors. In other cases, complex analog and digital circuitry may be provided on the same semiconductor chip, thereby offering enhanced control functionality for a plurality of electronic devices. Upon reducing the feature sizes of the semiconductor circuit elements in the device level, however, the dimensions of the metal lines and vias in the wiring level of the semiconductor devices also have to be reduced since the contact areas of the circuit elements have to be connected to the metallization level so that at least the contact structure and lower lying metallization levels may also require a significant reduction in size of the individual metal lines and vias.

It should be appreciated that, for highly scaled semiconductor devices, typically, electrical performance of the metallization system including the contact level has a significant influence on the overall performance of the semiconductor device due to parasitic capacitance and the parasitic resistivity of the metal features. Consequently, in modern semiconductor devices, frequently, highly conductive metals, such as copper and the like, may be used in combination with dielectric materials of reduced permittivity in order to restrict signal propagation delay caused by the metallization system. On the other hand, in the device level, a reduction of the channel length of field effect transistors in combination with very high dopant concentrations in the drain and source regions and gate electrodes may be used in view of reducing the overall series resistance of the individual circuit elements. However, in order to further reduce the series resistance of transistor devices and other circuit elements in the device level, the resistivity of highly doped silicon-based semiconductor areas is typically reduced by incorporating an appropriate metal species, for instance in the form of a metal silicide. The corresponding metal silicide may have a reduced sheet resistivity compared to even highly doped semiconductor materials and, hence, a respective manufacturing sequence is typically incorporated in sophisticated process techniques in order to form appropriate metal silicide regions in the drain and source areas or other contact areas of circuit elements, possibly in combination with providing a respective metal silicide in the gate electrodes.

Recently, well-approved metal silicides in the form of cobalt di-silicide are increasingly being replaced by metal silicide components of enhanced conductivity, such as nickel silicide. Although significant performance advantages may be associated with the incorporation of a nickel silicide into the drain and source areas of the transistors, it turns out, however, that, in the manufacturing sequence for forming metal silicides, significant yield loss and a less than expected increase of performance may be observed in view of device failures, which may frequently be caused by short circuits "shorting" the PN junctions of the transistors in the drain and source areas.

These device failures are frequently associated with a pronounced surface topography of the active semiconductor regions, which in turn may be caused by a complex manufacturing sequence for forming sophisticated transistor devices, in particular with P-channel transistors. For example, a significant gain in performance may be accomplished by inducing certain strain conditions in the active regions of the transistors since a strained silicon material may have significantly altered electronic characteristics, in particular with respect to charge carrier mobility, which may be taken advantage of with respect to increasing overall conductivity and thus switching speed of the transistors. To this end, appropriate semiconductor alloys, such as silicon/germanium and the like, are frequently incorporated into a portion of the active regions by selective epitaxial growth techniques in order to obtain a strained state of the grown semiconductor alloy due to a mismatch of the natural lattice constants of these materials with respect to the lattice constant of the silicon base material.

In other sophisticated approaches, the electronic characteristics of at least a portion of the active region may be adjusted, for instance, in terms of threshold voltage of the transistors by incorporating an appropriate semiconductor alloy, such as a silicon/germanium alloy, which may thus result in a modification of the band gap energy at the vicinity of an interface formed by a gate dielectric material and the active region. For example, in sophisticated approaches, gate electrode structures of field effect transistors may be provided on the basis of a high-k dielectric material in combination with a metal-containing electrode material, which may require appropriate adaptations of the electronic characteristics of the active region, at least in the vicinity of the gate dielectric material for at least some transistor devices. Also in this case, sophisticated selective epitaxial growth techniques are usually applied, which may also result in a modified surface topography, thereby causing significant irregularities upon forming the metal silicide regions, in particular of P-channel transistors, as will also be explained in more detail with reference to FIGS. 1a-1f.

FIG. 1a schematically illustrates a top view of a semiconductor device 100 in which a transistor 150, i.e., a field effect transistor, is provided, in the form of a P-channel transistor. As illustrated, the transistor 150 comprises a semiconductor region 103, which is also referred to herein as an active region, indicating that at least one transistor is to be formed in and above the corresponding semiconductor region. The active region 103 is typically formed from a silicon-based semiconductor layer, which is appropriately laterally divided into a plurality of active regions by means of an isolation region 102, such as a shallow trench isolation region comprised of silicon dioxide, silicon nitride and the like. Furthermore, a gate electrode structure 160 is formed on the active region 103 and extends also into the isolation region 102 as may be required for connecting to other transistors and/or for allowing the reliable contacting of the gate electrode structure 160 by appropriate contact elements, as is also discussed above. As indicated above, the isolation region 102 may laterally delineate the active region 103, thereby defining respective sidewalls 103S, which thus represent the boundaries of the active region 103 in a width direction, indicated as W. Similarly, in a length direction L, sidewalls 103T represent the boundaries of the active region 103, which, in the illustrative embodiment, may have a substantially rectangular shape.

FIG. 1b schematically illustrates a cross-sectional view taken along the line Ib of FIG. 1a. As illustrated, the isolation region 102 formed in a semiconductor layer 103H may be significantly recessed, as indicated by 102R, with respect to the active region 103. The degree of recessing 102R may significantly depend on the process history of the transistor 150, wherein, in sophisticated applications, the corresponding sidewalls 103T may be represented by rather steep sidewalls, which may have a significant influence on the finally obtained dopant profile of drain and source regions 151. Moreover, in the manufacturing stage shown, the gate electrode structure 160 is formed on the active region 103 and comprises a sidewall spacer structure 165, which is typically used as an implantation mask when adjusting the concentration profile of the drain and source regions 151 and which may also be used in the subsequent processing, at least partially, as a mask for forming metal silicide regions in the active region 103. Furthermore, the gate electrode structure 160 comprises an electrode material 161, such as a polysilicon material and the like, possibly in combination with a metal-containing electrode material 162, such as titanium nitride and the like. Furthermore, a gate dielectric layer 164, possibly in combination with a high-k dielectric material 163, may be provided in sophisticated applications. Furthermore, as shown, a strain-inducing semiconductor alloy 103A, for instance in the form of a silicon/germanium alloy and the like, may be provided so as to induce certain strain conditions in order to improve overall transistor performance. For example, by incorporating a silicon/germanium alloy as the material 103A, a compressive strain is induced, which in turn may result in superior conductivity of holes, thereby improving performance of P-channel transistors. Furthermore, a semiconductor alloy 103B, such as a silicon/germanium alloy, may be provided as a part of the active region 103 in order to adjust the threshold voltage of the transistor 150 in combination with the gate electrode structure 160, which may have incorporated therein a high-k dielectric material and the electrode material 162.

It should be appreciated that, in some sophisticated transistor architectures, a buried insulating layer (not shown) may be formed below the semiconductor layer 103H, when a silicon-on-insulator (SOI) configuration is to be used. In this case, the significant recessing 102R may extend almost down to the buried insulating layer.

FIG. 1c schematically illustrates a cross-sectional view of the device 100 along the line Ic of FIG. 1a. As shown, also in this case, the sidewalls 103S, i.e., the sidewalls delineating the active region 103 in the length direction (see FIG. 1a), may have a rather steep configuration. Moreover, as shown, the drain and source regions 151 may extend to a certain depth within the active region 103, depending on the implantation parameters used for incorporating the drain and source dopant species, as will be described later on in more detail. Furthermore, in an SOI architecture, the depth of the drain and source regions may be selected so as to extend to the buried insulating layer, wherein, typically, the dopant concentration at the bottom of the deep drain and source regions 151D is less than in an upper portion thereof.

It should be appreciated that, for convenience, the gate electrode structure 160, which would actually not be visible in this section, is indicated in dashed lines.

The semiconductor device 100 as shown in FIGS. 1a-1c may be formed on the basis of the following process strategies. The size, position and shape of the active region 103 is determined by forming the isolation region 102, which may be accomplished by applying well-established lithography, etch, deposition, planarization and anneal techniques in which appropriate trenches are formed in the semiconductor layer 103H, thereby obtaining a plurality of active regions such as the region 103. Prior to or after forming the isolation region 102, the basic dopant concentration in the various active regions 103 may be established by, for instance, ion implantation in combination with an appropriate masking regime so as to provide the active regions for P-channel transistors and N-channel transistors, possibly with different threshold voltage values, as required by the overall design rules. Thereafter, appropriate materials are deposited or formed and are appropriately patterned on the basis of highly complex lithography techniques and etch processes in order to form the gate electrode materials 161, 162 and the dielectric materials 163, 164. A corresponding process sequence may comprise a plurality of complex patterning processes in order to incorporate appropriate work function metal species for the corresponding transistor type under consideration.

Furthermore, as discussed above, if the semiconductor alloy 103B is to be provided, for instance when requiring a corresponding adaptation of the electronic characteristics, for instance when providing sophisticated gate materials, the complex gate patterning process is preceded by a process sequence in which an appropriate semiconductor alloy is selectively grown on those active regions that require a corresponding adaptation of the electronic characteristics. During the corresponding process sequence, hard mask materials have to be provided and patterned, followed by cleaning processes and the selective epitaxial growth process, wherein this sequence may generally result in a more or less pronounced material loss in the isolation regions 102, for instance caused by patterning the hard mask materials, performing cleaning processes and removing the hard mask materials. After patterning the gate electrode materials 161, 162, the processing may be continued by forming cavities in the active region 103 in order to incorporate the semiconductor material 103A, if required, wherein also a complex process sequence is to be applied, i.e., the etching of the active region 103, while masking any other active regions that do not require the incorporation of the strain-inducing semiconductor material, such as active regions of N-channel transistors. Furthermore, the complex process may include performing any cleaning processes and finally depositing the material 103A, followed by the removal of any hard mask materials, which may also result in significant material erosion in the isolation regions 102. Thereafter, if required, implantation processes are typically applied for forming a portion of the drain and source regions 151.

Generally, it is to be noted that, upon reducing the overall transistor dimensions and in particular the gate length, i.e., in FIG. 1*b*, the horizontal extension of the electrode materials 161, 162, an appropriate adaptation of the drain and source concentration profiles has to be applied in order to preserve the desired transistor characteristics, such as channel controllability, leakage currents and the like. On the other hand, in view of reducing the overall series resistance in the transistors, a relatively high dopant concentration is to be provided in the drain and source regions 151. Frequently, in the vicinity of a channel area 155, the depth of the concentration profile is to be selected less compared to the depth of the concentration profile of "deep" drain and source regions 151D. To this end, typically any drain and source extension regions 151E may be formed, for instance by providing an appropriate offset spacer element (not shown) and incorporating drain and source dopant species with an appropriate implantation energy and dose. Thereafter, the spacer structure 165 may be formed and further implantation processes are typically applied so as to incorporate further drain and source dopant species in order to form the regions 151D that appropriately connect to the extension regions 151E. Similarly, the depth of the concentration profile of the regions 151D is to be reduced upon further shrinking the overall transistor dimensions. Thus, the depth of the areas 151D may be comparable or even less than the degree of recessing 102R.

FIG. 1*d* schematically illustrates the device 100 in a further advanced manufacturing stage. As shown, a metal silicide 166 is formed in the gate electrode structure 160 and also a metal silicide 156 is formed in the active region 103. As discussed above, typically, the metal silicide regions 156 are provided so as to reduce the overall contact resistivity between contact elements (not shown) to be formed in a later manufacturing stage, which in turn connect the transistor 150 to a metallization system still to be formed. In highly scaled semiconductor devices, the contribution of the contact resistivity with respect to the overall performance of the transistor 150 is increasingly gaining in importance so that sophisticated materials are typically provided in the active region 103 in view of superior device performance. For example, nickel, possibly in combination with a certain amount of platinum, is frequently used in order to form nickel silicide. It turns out, however, that nickel silicide forms a Schottky barrier with a semiconductor material, wherein the height of the barrier may be significantly reduced when increasing the dopant concentration of the adjacent semiconductor material. Thus, in view of providing a maximum surface area of the metal silicide 156 that is available for charge carrier exchange with the drain and source regions 151, any interfaces formed by the silicide material 156 and semiconductor material should be positioned within highly doped areas of the drain and source regions 151. If a relatively high Schottky barrier exists between a moderately doped semiconductor material and the nickel silicide 156, extension of the metal silicide 156 into the remaining active region 103, i.e., "shorting" the corresponding PN junctions, may be disadvantageous in bulk configuration due to significantly increased leakage currents and other parasitic effects, since even a short circuit may be induced for operating voltages that are comparable to the relatively high Schottky barrier. Furthermore, a "shorting" of the PN junctions, although tolerable, may also be disadvantages in an SOI architecture, since the relatively high Schottky barrier caused by the moderate doping concentration in the well region may result in increased series resistance of the transistor, even though the transistor may remain substantially functional. On the other hand, the reduced dopant concentration in the deeper areas of the drain and source regions 151 may also cause reduced transistor performance, even though the metal silicide regions 156 may be embedded in the drain and source regions, since current flow from contact elements to the transistor may preferably occur via the metal silicide. In this case, however, the deep areas of the metal silicide 156 may contribute to a significantly increased overall resistance due to the relatively pronounced Schottky barrier.

That is, during the silicidation process, typically an appropriate refractory metal is deposited and is subsequently heat treated so as to initiate silicon and metal diffusion. On the other hand, chemical reaction is substantially suppressed on any dielectric surface areas. Consequently, the spacer structure 165 and the isolation region 102 may act as efficient silicidation masks, while on the other hand the sidewalls 103T and 103S (see FIG. 1*c*) are efficiently silicided, thereby forming the metal silicide 156 that may thus be positioned outside of the deep drain and source areas 151D or may be positioned in an area of the drain and source regions which have a reduced dopant concentration, thereby encountering an increased Schottky barrier.

FIG. 1*e* schematically illustrates the situation in the cross-sectional view as indicated in FIG. 1*a* as section Ic, wherein also at the sidewalls 103S, metal silicide 156D extends deeply into the active region 103.

FIG. 1*f* schematically illustrates a top view of the device 100 in which the peripheral areas 103P at or in the vicinity of the sidewalls 103T, 103S are illustrated, in which the metal silicide may extend deeply into the active region 103, thereby possibly causing significant device failures or generally reducing overall performance of the transistor devices.

Consequently, in particular, sophisticated P-channel transistors may suffer from increased yield loss and reduced performance, when the gate length may be 40 nm and less in transistor architectures requiring the incorporation of a strain-inducing silicon/germanium alloy, thereby making this basically a very promising approach less attractive in volume production environments. Therefore a plurality of approaches has been discussed. For example, avoiding the significant recessing of the isolation structures 102 during the formation of sophisticated P-channel transistors has been proposed, however, without giving any details as to the practical implementation of an improved strategy in this respect. Another alternative would be the increase of the drain and source dopant concentration by implanting a higher dopant dose. As discussed above, however, significantly modifying the dopant concentration in highly scaled transistors may be associated with a plurality of additional effects, which in turn may not be compatible with the overall device requirements. In this respect, it turns out that the dopant concentration is strictly limited for a technology of 40 nm and less, since otherwise the drain and source regions would unduly penetrate the channel region and increase the device leakage currents. That is, a higher dose implantation process without additional lateral dopant diffusion into the channel region would require increased width of the corresponding spacer elements, which is generally not compatible with sophisticated device architectures due to a limited pitch of gate electrode structures in densely packed device regions. Therefore, an increase of implantation dose may not be a promising solution.

Instead of increasing the implantation dose, the implantation energy could be increased in order to generate a more homogeneous dopant profile throughout the depth of the drain and source regions. It turns out, however, that significant increase of the implantation energy may not be compatible with the overall gate configuration, that is, undue dopant incorporation into the channel region may occur upon increasing the implantation energy.

A promising approach is described in the non-published U.S. patent application Ser. No. 13/052,583, filed by the applicant of the present application, entitled "Shallow Source and Drain Architecture in an Active Region of a Semiconductor Device Having a Pronounced Surface Topography by Tilted Implantation." According to this concept, tilted implantation processes may be applied with tilt angles of 30 degrees or greater in an attempt to incorporate additional dopant species into the deeper drain and source areas through exposed sidewall surface areas in order to embed the resulting deep metal silicide regions in a semiconductor material of increased dopant concentration. Upon applying this concept, however, it has been observed that the resulting gain in transistor performance is less pronounced as expected, thereby indicating that the significant surface topography of the active region of, in particular, P-channel transistors still significantly influences the behavior of sophisticated semiconductor devices. Therefore, the concept disclosed in this patent application may still require additional improvement in order to provide a strategy appropriate for volume production techniques in view of semiconductor devices including p-channel transistors having a gate length of 40 nm and less in combination with sophisticated gate electrode structures.

In view of the situation described above, the present disclosure relates to manufacturing techniques and semiconductor devices in which appropriate contact areas, such as metal silicide regions, may be provided in active regions requiring a sophisticated dopant profile and having a pronounced surface topography, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the probability of creating device failures upon forming contact regions, such as metal silicide regions, in sophisticated semiconductor devices is reduced by appropriately adapting the dopant profile to the pronounced surface topography of the active regions of P-channel transistors. It has been recognized that the implantation of the drain and source dopant species at an appropriately selected tilt angle with respect to the width direction of the active region may result in superior transistor performance of the P-channel transistors, while undue lateral penetration of the channel region by the drain and source dopants is suppressed by avoiding the usage of any tilt angle along the length direction of the active region. In some illustrative embodiments of the present disclosure, that tilt angle is restricted to a range of 20 degrees and less, thereby obtaining superior performance for sophisticated P-channel transistors with a gate length of 40 nm and less. Consequently, appropriate spacer technologies may still be applied so as to adjust the lateral dopant profile in the vicinity of the channel region, while nevertheless an increased averaged dopant concentration is obtained at peripheral areas of the active region so that superior resistance conditions across the full width of the transistor may be achieved. Hence, the resulting metal silicide may be reliably embedded in highly doped semiconductor material, however, without unduly affecting the lateral dopant profile in the vicinity of the channel region, since the inclination or tilt during the implantation occurs in a plane that is normal to the top surface of the active region and substantially parallel to the gate electrode structure.

One illustrative method disclosed herein comprises performing an implantation process in the presence of a gate electrode structure so as to introduce drain and source dopant species through a first sidewall and a second sidewall of an active region of a P-channel transistor of a semiconductor device, wherein the active region is laterally enclosed by an isolation region that is recessed with respect to the active region and wherein the first and second sidewalls define a width of the active region. Furthermore, the method comprises forming a metal silicide in the active region.

A further illustrative embodiment disclosed herein comprises forming a gate electrode structure on an active region of a semiconductor device, wherein the active region has a length and a width and is laterally delineated by an isolation region that is recessed with respect to the active region. The method further comprises introducing drain and source dopant species into the active region by performing an implantation process, which includes at least two different tilt angles with respect to a normal of a top surface of the active region and defined in a first plane that is normal to the top surface of the active region and parallel to a width direction. The implantation process further includes a non-varying implantation angle defined in a second plane that is normal to the top surface and perpendicular to the width direction. Additionally, the method comprises forming a metal silicide in a portion of the active region.

One illustrative semiconductor device disclosed herein comprises an isolation region formed above a substrate. Moreover, the semiconductor device comprises a silicon-containing active region of a P-channel transistor laterally enclosed by the isolation region, which is recessed with respect to the silicon-containing active region. The silicon-containing active region has a length delimited by a pair of first sidewalls and a width delimited by a pair of second sidewalls. Additionally, the semiconductor device comprises a gate electrode structure formed on the silicon-containing active region and drain and source regions. The drain and source regions comprise a first averaged dopant concentration at the first sidewalls that is less than a second averaged dopant concentration at the second sidewalls. Moreover, the semiconductor device comprises a metal silicide formed in a portion of the silicon-containing semiconductor region, wherein the metal silicide is positioned within the drain and source regions.

BRIEF DESCRIPTION OF THE DRAWINGS

The disclosure may be understood by reference to the following description taken in conjunction with the accompanying drawings, in which like reference numerals identify like elements, and in which:

FIGS. 1b and 1c schematically illustrate cross-sectional views of the semiconductor device as shown in FIG. 1a;

Figure 1A:
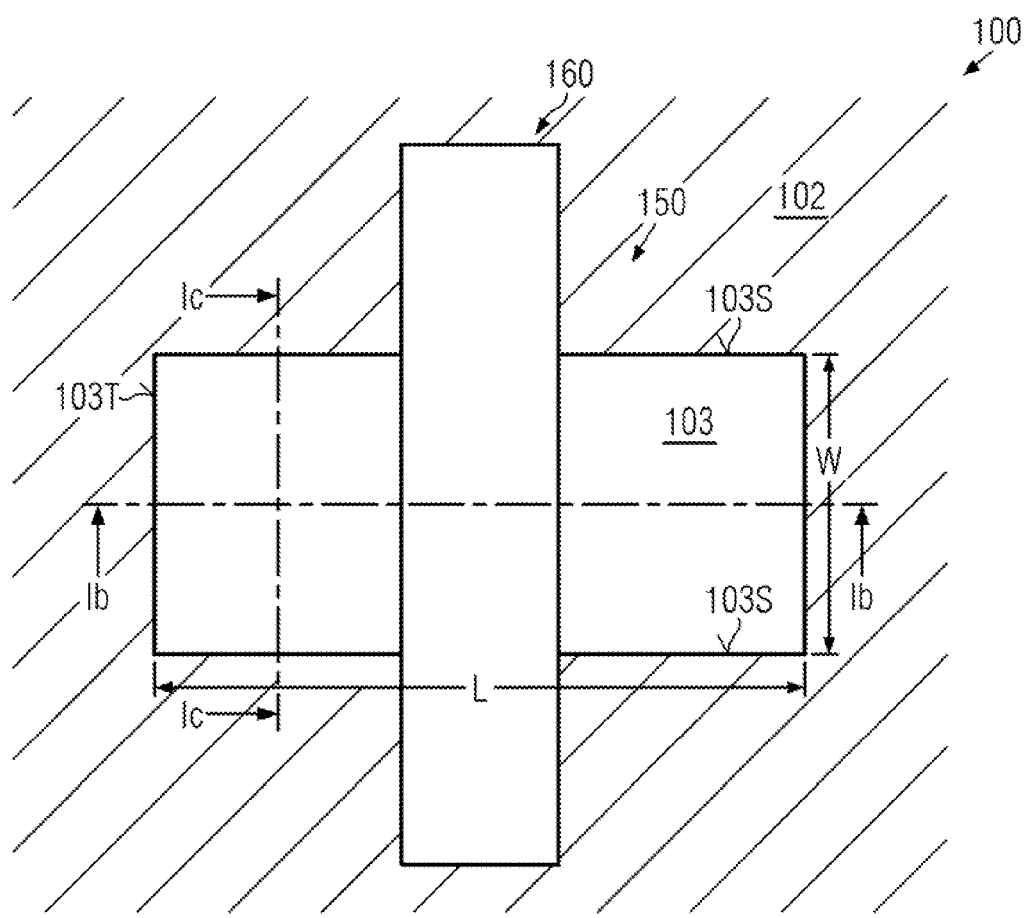
FIG. 1a schematically illustrates a top view of a semiconductor device formed according to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally addresses the problem of reduced transistor performance in sophisticated P-channel transistors due to a pronounced surface topography in combination with metal silicide regions, wherein the solution as proposed in the above-identified co-pending US application may result in a less than expected gain in performance, although a certain amount of dopant species may be incorporated through exposed sidewall surface portions of the active regions. It has been recognized that superior transistor performance for P-channel transistors may be accomplished without unduly contributing to the overall process complexity by restricting the incorporation of drain and source dopant species to exposed sidewall surface areas, which define the width of the P-channel transistor. In this manner, highly sophisticated lateral dopant profiles at the channel areas may still be obtained on the basis of appropriate spacer techniques, since the used angles may not substantially affect the lateral dopant profile in this sensitive area. On the other hand, at the periphery with respect to the transistor width, a significantly increased averaged dopant concentration is obtained, thereby contributing to superior drive current capability, since, even at the peripheral regions, a reduced transition resistance from the metal silicide into the semiconductor material may be achieved due to the increased averaged dopant concentration. In particular for SOI devices, in which a "shorting" of the PN junctions may not result in nonfunctional transistors, a significant increase of overall performance of the P-channel transistors may be observed.

Furthermore, it has been recognized that the tilted implantation parallel to the gate electrode structure may be restricted to tilt angles on the magnitude of 20 degrees and less, thereby obtaining superior performance compared to larger tilt angles. Without intending to restrict the present application to the following explanation, it is assumed that a moderate tilt angle parallel to the gate electrode structure may, on the one hand, result in an increased averaged dopant concentration at the peripheral regions that define the width of the transistor, and, on the other hand, enable a more homogeneous dopant distribution in the remaining portion of the drain and source regions. For example, upon selecting a moderate tilt angle in the above-specified range, the implantation energy may be appropriately adapted so as to still retain a desired penetration depth without inducing undue modifications or damage in sensitive device areas, for instance at end portions of the gate electrode structure. Thus, in some illustrative embodiments, the drain and source regions, i.e., the deep portions thereof, may be formed on the basis of the tilt angle of moderate amount with an appropriately adapted implantation energy without requiring any further adaptation of the overall process flow. On the other hand, the lateral dopant profile in the vicinity of the channel region is substantially not affected so that the dopant profile in this area may still be efficiently adjusted on the basis of sidewall spacers and the like.

In some illustrative embodiments, the gate electrode structures of the P-channel transistors may have the same orientation throughout the entire semiconductor device so that a single implantation process without any additional masking steps may be applied. That is, during the implantation process, the semiconductor device may be rotated by 180 degrees in order to realize at least two different tilt angles, which may have the same or a different amount, so that, in a zero degree position and a 180 degrees position, dopant species may be efficiently incorporated into the peripheral areas of the active region.

In other illustrative embodiments, transistors having differently oriented gate electrode structures or active regions may be covered by an appropriate implantation mask so as to not unduly affect the lateral dopant profile in the vicinity of the channel regions of these transistors. Thereafter, a further implantation process, for instance using the same process parameters, may be applied after removing the implantation mask and covering the previously implanted transistors with a further implantation mask.

With reference to FIGS. 2a-2f, further illustrative embodiments will now be described in more detail, wherein reference may also be made to FIGS. 1a-1f, if required.

Figure 2A:
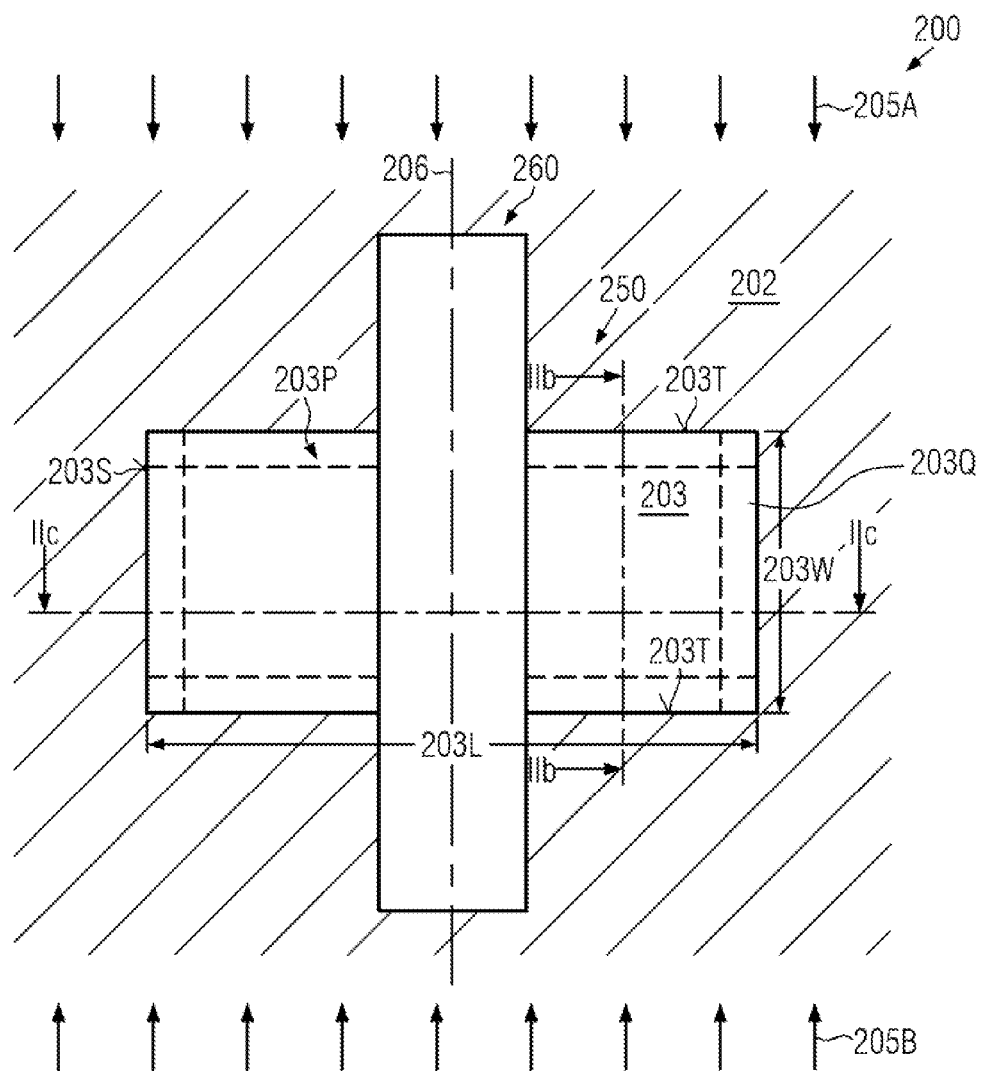
FIG. 2a schematically illustrates a top view of a semiconductor device according to illustrative embodiments in which implantation strategies are illustrated in order to incorporate a drain and source dopant species through exposed sidewall areas of an active region in a substantially parallel manner with respect to the gate electrode structure, according to illustrative embodiments.

FIG. 2a schematically illustrates a top view of a semiconductor device 200 comprising a semiconductor region or active region 203, in and above which a P-channel transistor 250 is formed. The semiconductor region or active region 203 may be comprised of a silicon-containing semiconductor material, which may enable the formation of a metal silicide in a later manufacturing stage. As shown, the active region 203 may have a width 203W, i.e., the lateral dimension along a width direction (FIG. 1a), wherein it should be appreciated that the width 203W may vary along a length 203L of the active region 203 if a non-rectangular geometric configuration is to be considered. The size, shape and position of the active region 203 is determined by an isolation region 202, as is also discussed above with reference to the semiconductor device 100. Moreover, in the manufacturing stage shown, a gate electrode structure 260 is formed on the active region 203 and also extends into the isolation region 203, depending on the overall device configuration.

Figure 1B:
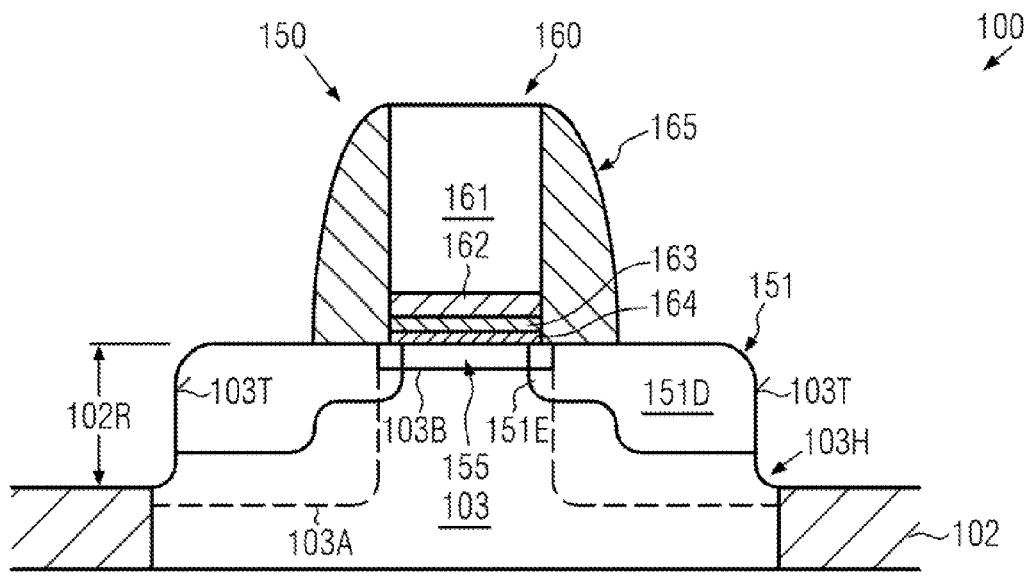
Figure 1C:
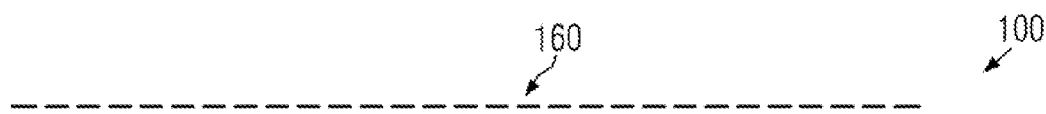
Figure 1C:
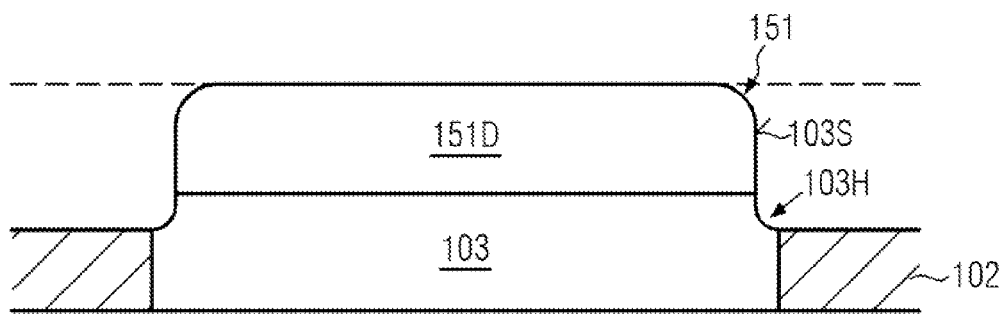
Figure 1D:
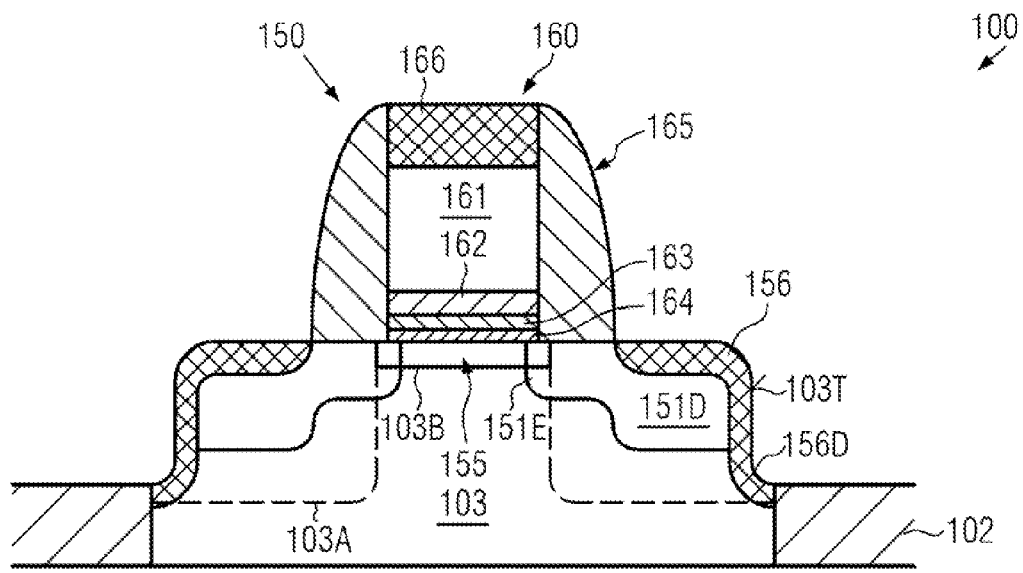
FIGS. 1d-1f schematically illustrate cross-sectional views and a top view, respectively, of the semiconductor device in a further advanced manufacturing stage in which metal silicide regions are formed in shallow drain and source regions on the basis of conventional process strategies.
Figure 1E:
Figure 1E:
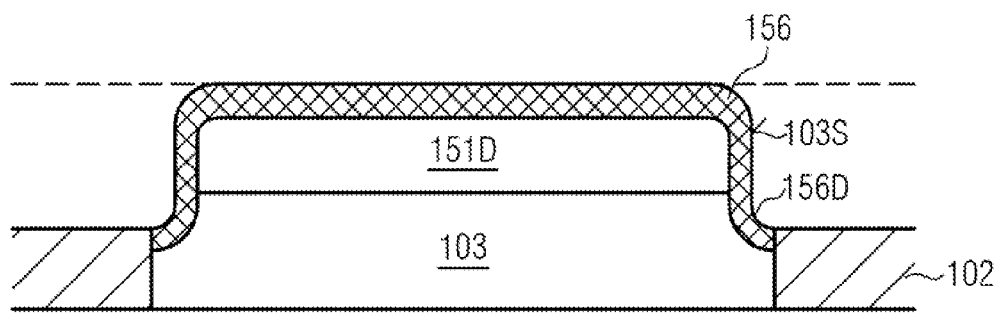
Figure 1F:
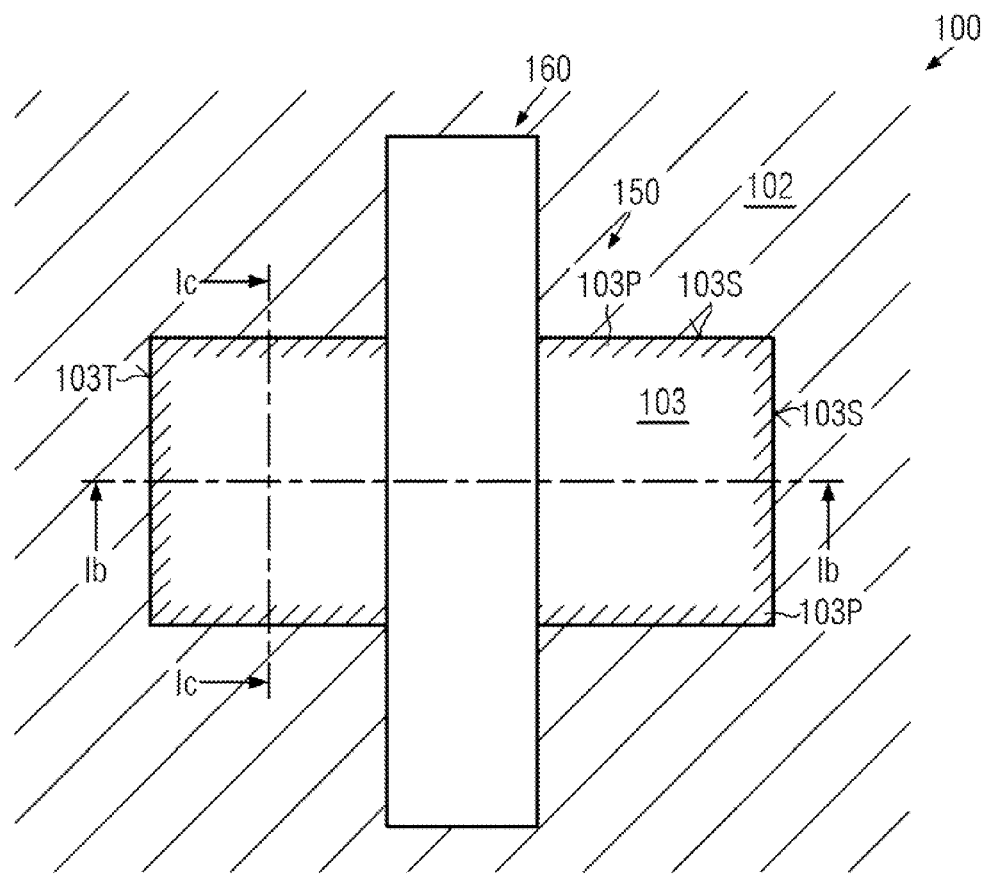

Generally, the transistor 250 may have any appropriate configuration, for instance the transistor 250 may have a configuration as shown in FIGS. 1b and 1c when referring to the transistor 150, for instance with respect to the configuration of the active region 203 and with respect to the gate electrode structure 260. In other cases, these components may have any other appropriate configuration, as required. Furthermore, in the manufacturing stage shown, the transistor 250 may receive a drain and source dopant species in order to implement an increased averaged concentration which may provide superior process conditions at a peripheral area 203P upon forming appropriate contact areas, such as metal silicide regions in a later manufacturing stage. As previously discussed with reference to the semiconductor device 100 as shown in FIG. 1f, the periphery 203P, for instance at sidewalls 203T defining the width 203W, may be highly critical and may be exposed due to the recessed configuration of the isolation region 202. It has been recognized, however, that peripheral areas 203Q at sidewalls 203S that define a length 203L may be less critical, for instance with respect to SOI architectures and with respect to configurations in which other components may cover the peripheral regions 203Q, for instance when forming dummy gate electrode structures and the like. The width of the peripheral areas 203P, 203Q may be 20 nm or less. Thus, in some illustrative embodiments, at least a portion of the drain and source dopant species may be incorporated through the exposed sidewall surface areas 203T by applying implantation processes using an appropriate tilt angle. For example, as shown in FIG. 2a, in some illustrative embodiments, an implantation process may comprise a first implantation step 205A in which an appropriate tilt angle is used in order to incorporate the drain and source dopant species through one of the sidewalls 203T, and a second implantation step 205B may be applied so as to incorporate the dopant species through the oppositely positioned sidewall 203T. To this end, for each of the implantation steps 205A, 205B, a respective tilt angle with an amount or magnitude of 20 degrees or less may be selected in a plane 206 that is parallel to the width direction, i.e., in FIG. 2a, the vertical direction. For example, for a substantially non-tilted implantation direction, which corresponds to a direction perpendicular to the drawing plane of FIG. 2a, a tilt of the implantation direction in a plane that is perpendicular to the drawing plane of FIG. 2a and that is aligned, i.e., parallel, to the width direction, may result in appropriate tilt angles for the implantation steps 205A, 205B, respectively.

As discussed above, by selecting the magnitude or amount of the tilt angles of the implantation steps 205A, 205B according to the above-specified range, the lateral dopant profile in the vicinity of the gate electrode structure 260 may still be adjusted by any sidewall spacers formed thereon, which thus enables the implementation of reduced gate length of 40 nm and less, such as 32 nm and less. In some illustrative embodiments, the magnitude of the respective tilt angles during the implantation steps 205A, 205B is selected to 15 degrees or less, while in other cases a tilt angle is selected with an amount of 8.5-12.5 degrees.

Figure 2B:
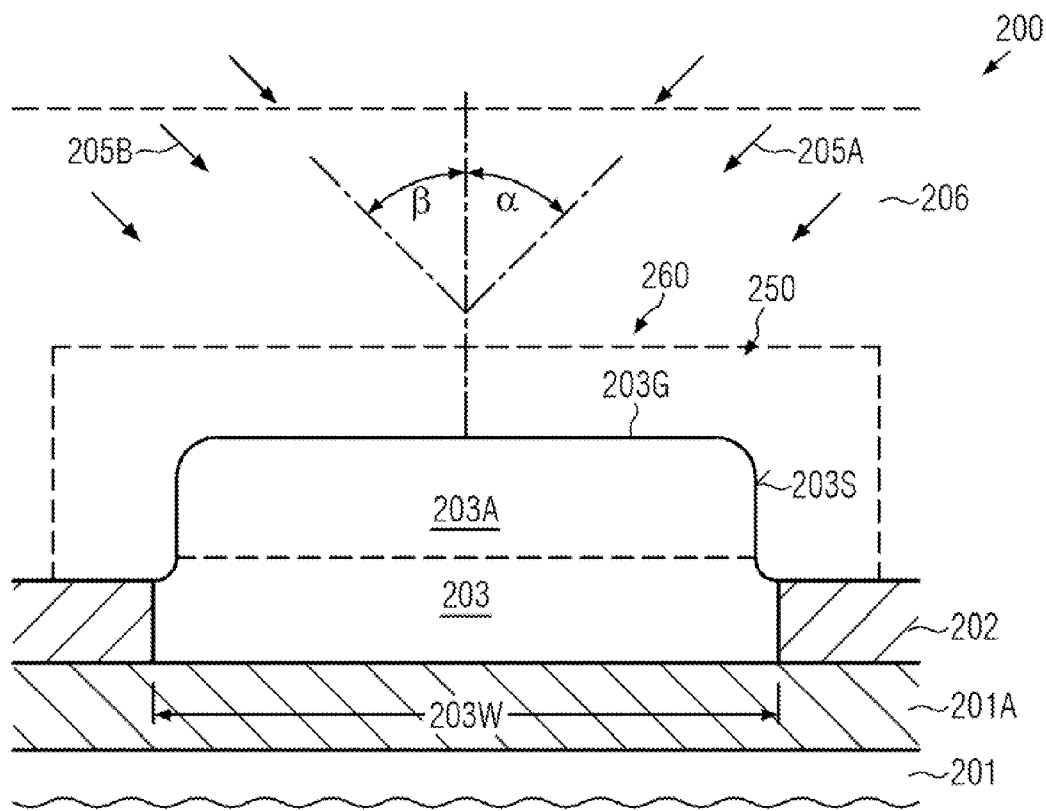
FIGS. 2b and 2c schematically illustrate cross-sectional views of the semiconductor device in which a tilted implantation process is applied with parallel orientation with respect to the gate electrode structure, according to illustrative embodiments.

FIG. 2b schematically illustrates a cross-sectional view taken along the width direction, i.e., along the section IIb of FIG. 2a. As shown, the semiconductor device 200 may comprise a substrate 201, above which may be formed the active region 203, which may represent a corresponding semiconductor island of a semiconductor layer, as is also discussed above with reference to the semiconductor device 100. In the embodiment shown, a buried insulating layer 201A may be provided below the active region 203, thereby forming an SOI architecture. Furthermore, the isolation region 202 may be significantly recessed compared to a top surface 203G of the active region, as is also previously discussed, for example due to a previously performed process sequence for incorporating a strain-inducing semiconductor alloy 203A, such as a silicon/germanium alloy, as is also previously explained. It should be appreciated that, with reference to the components described so far, the same criteria may apply as previously discussed with reference to the semiconductor device 100. Hence, a corresponding detailed description of these components and techniques for forming the same may be omitted.

As shown, the implantation process comprising the steps 205A, 205B may be performed on the basis of respective tilt angles α, β, which are defined in the plane 206. The plane 206 may be normal or orthogonal with respect to the top surface 203G and may be oriented in parallel to the width direction 203W, thereby enabling a variation of the implantation angle with respect to the exposed sidewall surfaces 203T, without affecting the lateral dopant profile in the vicinity of the gate electrode structure 260, which is indicated in dashed lines, which, however, would not be visible in the cross-sectional FIG. 2b. It should be appreciated that the tilt angles α, β may be considered as two different tilt angles, since, even if these angles are of the same magnitude, the orientation is different with respect to a normal of the top surface 203G. Consequently, upon selecting the tilt angles α, β to be 20 degrees or less, an appropriate implantation energy may be selected so as to obtain a desired relatively homogeneous dopant distribution within the active region 203 with an appropriate penetration depth, while additionally an increased dopant concentration may be obtained in the peripheral regions 203P (FIG. 2a) compared to conventional strategies. For example, the averaged dopant concentration in the peripheral region 203P may be higher compared to strategies in which a substantially non-tilted implantation is applied in order to form the deep drain and source regions in the active region 203. Furthermore, the averaged dopant concentration in the peripheral region 203P may be higher compared to the averaged dopant concentration at the peripheral regions 203Q (FIG. 2a), at least at a depth in the vicinity of the buried insulating layer 201A.

It should be appreciated that, due to the moderate magnitude of the tilt angles, a corresponding adaptation of the implant energies may not substantially affect any other device components or subsequent processes. That is, compared to tilt angles of 30 degrees and significantly higher, in the present embodiments, only a moderate increase of energy may be required so as to obtain substantially the target penetration depth. Consequently, the additional penetration length into the gate electrode structure 260 at end (see FIG. 2a) during the tilted implantation steps 205A, 205B may not alter the desired transistor characteristics, since typically the length of the end portions of the gate electrode structures 260 that extend above the isolation region 202 is greater compared to the additional penetration length caused by the moderate tilt angles α, β.

Figure 2C:
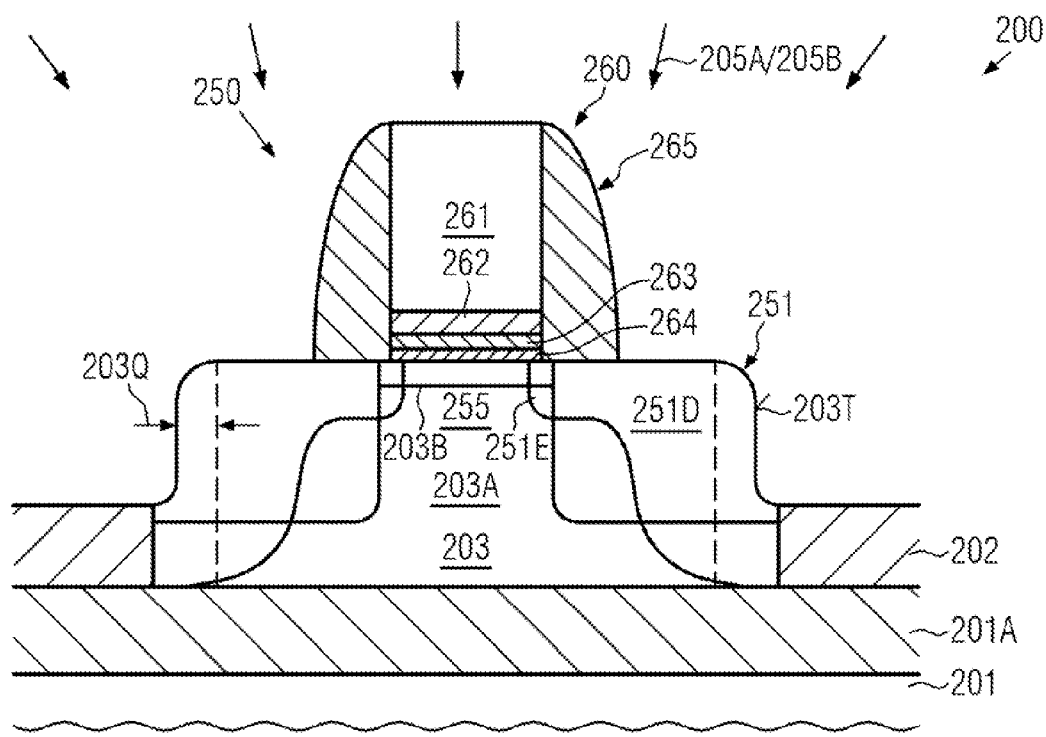

FIG. 2c schematically illustrates a cross-sectional view taken along a length direction, i.e., along the section IIc of FIG. 2a. As shown, the transistor 250 may comprise drain and source regions 251, deep portions 251D thereof may be formed during the implantation steps 205A/205B, as discussed above. Furthermore, the drain and source regions 251 may comprise extension regions 251E, which substantially determine the lateral dopant profile in a channel region 255. Furthermore, in some illustrative embodiments, a threshold voltage adjusting semiconductor alloy 203B may be formed as a part of the channel region 255 below the gate electrode structure 260. The gate electrode structure 260 may comprise gate dialectic materials 264, 263, for instance in the form of conventional dielectric materials, high-k dielectric materials and the like, as is also discussed above. Additionally, electrode materials 262 and 261 may be provided and these materials may be laterally encapsulated by a spacer structure 265 having an appropriate width so as to determine the lateral profile of the drain and source regions 251, as is also discussed above. The components described so far may be formed on the basis of manufacturing techniques as are also described above.

Upon performing the implantation process comprising the steps 205A/205B, the drain and source dopant species may be incorporated in a substantially vertical manner with respect to the top surface of the active region 203 so that the previously established lateral dopant profile of the extension regions 251E may not be significantly affected upon forming the deep drain and source regions 251D. Furthermore, since dopant penetration through the exposed portions of the sidewalls 203S (FIG. 2b) is substantially suppressed, a somewhat reduced averaged dopant concentration may be encountered in the peripheral regions 203Q compared to the peripheral regions 203P (see FIG. 2a), in particular in the vicinity of the buried insulating layer 201A.

Figure 2D:
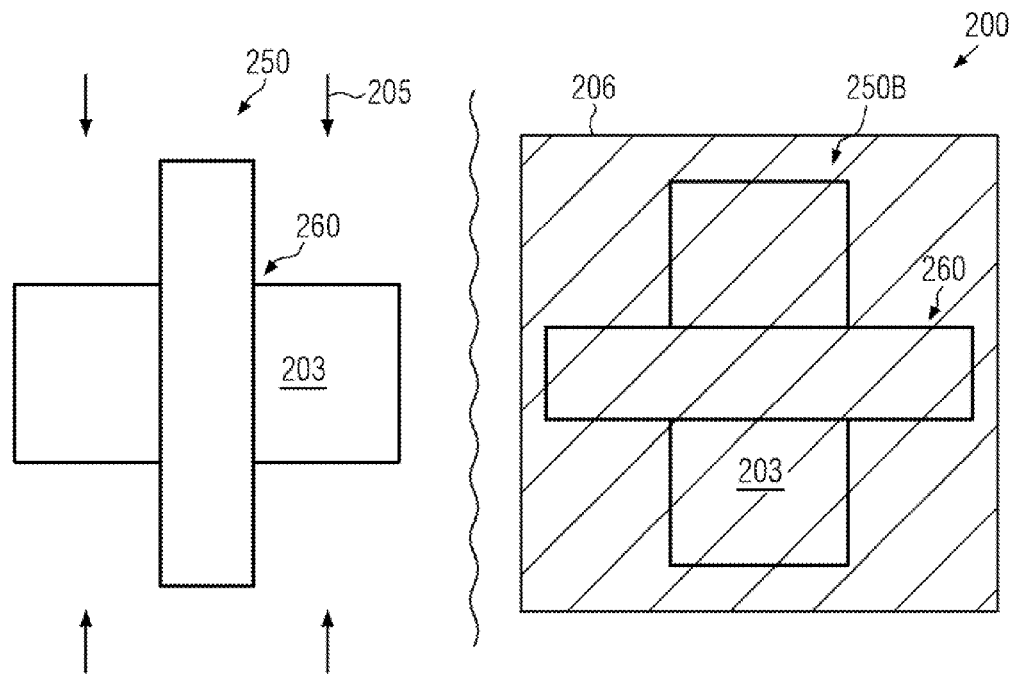
FIGS. 2d and 2e schematically illustrate top views of the semiconductor device according to illustrative embodiments in which P-channel transistors with different orientation may receive a tilted implantation parallel to the respective gate electrode structures based on appropriate masking regimes, according to illustrative embodiments.

FIG. 2d schematically illustrates a top view of the semiconductor device 200 according to further illustrative embodiments in which a second P-channel transistor 250B may be provided with an orientation that is different compared to the orientation of the transistor 250. For example, the gate electrode structure 260 of the transistor 250B may be oriented perpendicularly with respect to the gate electrode structure 260 of the transistor 250. In this case, during the implantation process 205, comprising the steps 205A, 205B as discussed above, the transistor 250B may be masked on the basis of an appropriate implantation mask 206, such as a resist mask. Thus, undue penetration of drain and source dopant species into areas covered by the gate electrode structure 260 of the transistor 250B may be avoided.

Figure 2E:
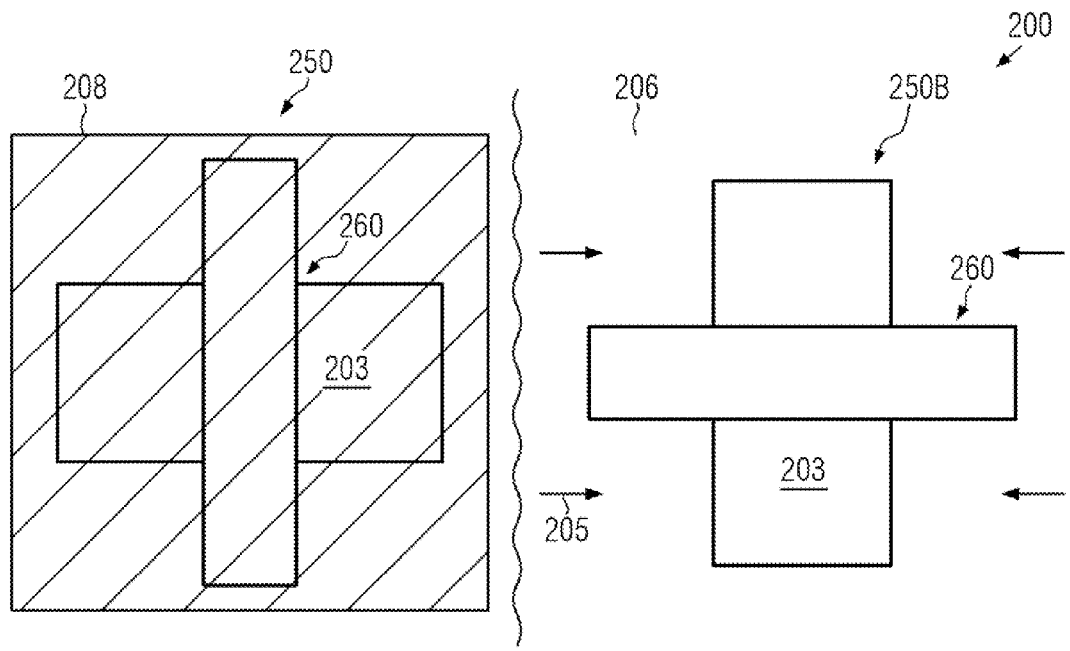

FIG. 2e schematically illustrates the device 200 in a further advanced manufacturing stage in which the transistor 250 is masked by an appropriate implantation mask 208, such as a resist mask, while the transistor 250B is exposed to the implantation process 205 comprising the steps 205A/205B as discussed above, wherein, however, generally the device 200 is appropriately adjusted to the corresponding ion beam of the process 205 so as to achieve a tilt angle parallel with respect to the gate electrode structure, as is also explained above. Consequently, the previously established dopant profile in the transistor 250 may be reliably preserved by the mask 208, while the process parameters of the process 205 may be appropriately selected for the transistor 250B. For example, the same implantation parameters and tilt angles may be selected, while, in other cases, at least one process parameter, such as the amount of the tilt angles, the implantation energy and the like, may be selected differently in order to appropriately tune the resulting transistor characteristics. It should be appreciated that the corresponding implantation masks may be readily formed on the basis of well-established lithography techniques.

Figure 2F:
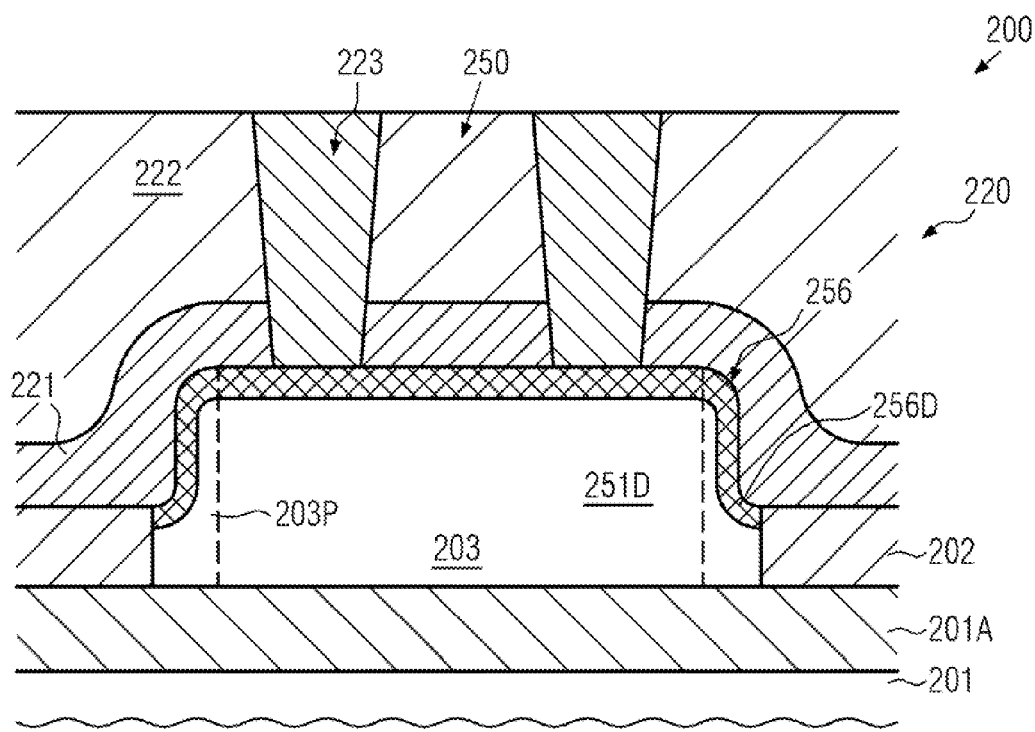
FIG. 2f schematically illustrates a cross-sectional view of the semiconductor device in further advanced manufacturing stages, in which an interlayer dielectric material of a contact level may comprise contact elements, which may have reduced contact resistance to the drain and source regions due to the increased averaged dopant concentration, according to still further illustrative embodiments.

FIG. 2f schematically illustrates a cross-sectional view of the semiconductor device 200 in a further advanced manufacturing stage. The cross-section is taken along the width direction, i.e., along the section IIb of FIG. 2a. As shown, a contact level 220 may be formed so as to enclose and thus passivate the transistor 250. To this end, appropriate dielectric materials, such as a layer 221 and a layer 222, for instance provided in the form of silicon nitride, silicon dioxide and the like, may be formed above the active region 203, wherein one or more contact elements 223 may be provided so as to connect to the drain and source regions 251. Furthermore, a metal silicide 256 may be formed in the active region 203 and may be substantially completely embedded in the deep drain and source regions 251D so as to ensure a reduced series resistance in the transistor 250. That is, since the metal silicide 256, which may be provided in the form of a nickel-containing silicide material, is embedded in a semiconductor material having a moderately high dopant concentration, the corresponding Schottky barrier is relatively low, thereby providing superior drive current capability. In particular due to the preceding process for forming the deep drain and source regions 251D, an increased averaged dopant concentration may be obtained in the peripheral regions 203P, which thus provides a current path that extends across the entire width of the active region 203, which in turn may translate into superior performance of the transistor 250.

The contact level 220 and the contact elements 223 may be formed on the basis of any well-established process techniques. It should be appreciated that the metal silicide 256 may be formed in accordance with process strategies as also previously discussed with reference to the semiconductor device 100, thereby providing superior process conditions at the peripheral regions 203P. In other cases, however, the metal silicide 256 may be formed locally at the contact elements 223, depending on the overall process strategy. Also in this case, the increased averaged dopant concentration and the peripheral regions 203P may contribute to superior transistor performance. Furthermore, in this case, a reduced contact resistance may be obtained, in the case that one or more of the contact elements 223 may be positioned in close proximity to the peripheral regions 203P.

As a result, the present disclosure provides manufacturing techniques and semiconductor devices in which overall drive current capability and thus generally performance of P-channel transistors may be enhanced by specifically incorporating an increased averaged dopant concentration at the peripheral regions 203P, which define the effective width of the P-channel transistors. It has been recognized that by having a tilted implantation parallel to the gate electrode structures, the deep drain and source regions may be formed such that superior dopant concentrations are obtained, while on the other hand undue lateral penetration of the channel areas may be avoided during the tilted implantation process. Furthermore, a magnitude of 20 degrees or less has been identified as a highly efficient tilt angle for P-channel transistors having a gate length of 40 nm and less. For example, for P-channel transistors of the 32 nm technology, improvement of transistor performance of several percent with respect to on-resistance and linear on-current has been observed for an amount of 10 degrees of the tilt angles during the formation of the deep drain and source regions compared to P-channel transistors formed on the basis of a non-tilted implantation sequence. It should be appreciated that the above-described embodiments refer to an SOI architecture, in which a "shortening" of the PN junctions may not result in a complete device failure. In other illustrative embodiments (not shown), a bulk configuration, i.e., a configuration in which the active region may directly connect to a crystalline semiconductor material of the substrate, may be used, thereby, in addition to achieving superior performance as described above, significantly reducing the probability of causing a short of the PN junctions in the vicinity of the peripheral regions that define the effective width of the transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing an implantation process in the presence of a gate electrode structure so as to introduce drain and source dopant species through a first sidewall and a second sidewall of an active region of a P-channel transistor of a semiconductor device, said active region being laterally enclosed by an isolation region that is recessed with respect to said active region, said first and second sidewalls defining a width of said active region, wherein performing said implantation process comprises using tilt angles with an amount of 20 degrees or less with respect to a normal of said active region; and
   forming a metal silicide in said active region.

2. The method of claim 1, wherein said tilt angle amount is selected to be 15 degrees or less.

3. The method of claim 2, wherein said tilt angle amount is selected to be in the range of 8.5-12.5 degrees.

4. The method of claim 1, wherein performing said implantation process further comprises forming deep drain and source regions in said active region.

5. The method of claim 1, wherein said implantation process is performed so as to be substantially non-tilted with respect to a plane that is normal to a top surface of said active region and parallel to a width direction.

6. The method of claim 1, further comprising covering a second active region with an implantation mask when performing said implantation process, wherein said second active region has formed thereon a second gate electrode structure that is not parallel to said gate electrode structure.

7. The method of claim 6, further comprising removing said implantation mask from said second active region, forming a further implantation mask so as to mask said active region and performing a second implantation process so as to introduce said drain and source dopant species through a first sidewall and a second sidewall of said second active region of a second P-channel transistor, wherein said first and second sidewalls of said second active region define a width of said second active region.

8. The method of claim 1, further comprising forming a semiconductor alloy in at least a portion of said active region by an epitaxial growth process prior to performing said implantation process.

9. The method of claim 8, wherein forming said semiconductor alloy comprises forming a compressive strain-inducing semiconductor alloy in said active region.

10. The method of claim 8, wherein forming said semiconductor alloy comprises forming a threshold voltage adjusting semiconductor alloy in said active region.

11. A method, comprising:
    forming a gate electrode structure on an active region of a semiconductor device, said active region having a length and a width and being laterally delineated by an isolation region that is recessed with respect to said active region;
    introducing drain and source dopant species into said active region by performing an implantation process, said implantation process including at least two different tilt angles with respect to a normal of a top surface of said active region and defined in a first plane that is normal to said top surface of said active region and parallel to a width direction, wherein an amount of each of said at least two different tilt angles is in a range of 8.5-20 degrees, said implantation process further including a non-varying implantation angle defined in a second plane that is normal to said top surface and perpendicular to said width direction; and
    forming a metal silicide in a portion of said active region.

12. The method of claim 11, wherein respective two of said at least two different tilt angles are of the same amount and different orientation.

13. The method of claim 11, wherein an amount of each of said at least two different tilt angles is 15 degrees or less.

14. The method of claim 11, wherein forming said gate electrode structure comprises forming a spacer structure prior to performing said implantation process and using at least a portion of said spacer structure as a mask.

15. The method of claim 11, further comprising forming a semiconductor alloy in at least a portion of said active region prior to performing said implantation process.

16. The method of claim 11, further comprising covering a second active region with an implantation mask when performing said implantation process, wherein said second active region has formed thereon a second gate electrode structure that is not parallel to said gate electrode structure.

17. The method of claim 16, further comprising removing said implantation mask from said second active region, forming a further implantation mask so as to mask said active region and performing a second implantation process.

18. A method, comprising:
performing an implantation process in the presence of a first gate electrode structure so as to introduce drain and source dopant species through a first sidewall and a second sidewall of a first active region of a first P-channel transistor of a semiconductor device, said first active region being laterally enclosed by an isolation region that is recessed with respect to said first active region, said first and second sidewalls defining a width of said first active region;
covering a second active region with an implantation mask when performing said implantation process, wherein said second active region has formed thereon a second gate electrode structure that is not parallel to said first gate electrode structure; and
forming a metal silicide in said first active region.

19. A method, comprising:
forming a first gate electrode structure on a first active region of a semiconductor device, said first active region having a length and a width and being laterally delineated by an isolation region that is recessed with respect to said first active region;
covering a second active region with an implantation mask, wherein said second active region has formed thereon a second gate electrode structure that is not parallel to said first gate electrode structure
while covering said second active region with said implantation mask, introducing drain and source dopant species into said first active region by performing an implantation process, said implantation process including at least two different tilt angles with respect to a normal of a top surface of said first active region and defined in a first plane that is normal to said top surface of said first active region and parallel to a width direction, said implantation process further including a non-varying implantation angle defined in a second plane that is normal to said top surface and perpendicular to said width direction; and
forming a metal silicide in a portion of said first active region.

* * * * *